United States Patent [19]
Tseng

[11] Patent Number: 5,907,775
[45] Date of Patent: May 25, 1999

[54] NON-VOLATILE MEMORY DEVICE WITH HIGH GATE COUPLING RATIO AND MANUFACTURING PROCESS THEREFOR

[75] Inventor: Horng-Huei Tseng, Hsinchu, Taiwan

[73] Assignee: Vanguard International Semiconductor Corporation, Hsin-Chu, Taiwan

[21] Appl. No.: 08/827,819

[22] Filed: Apr. 11, 1997

[51] Int. Cl.[6] .............................................. H01K 21/8247
[52] U.S. Cl. .......................................... 438/261; 438/593
[58] Field of Search .................................. 438/305, 593, 438/594, 257, 261; 257/316

[56] References Cited

U.S. PATENT DOCUMENTS

| | | | |
|---|---|---|---|
| 5,459,091 | 10/1995 | Hwang | 437/43 |
| 5,496,753 | 3/1996 | Sakurai et al. | 437/43 |
| 5,556,799 | 9/1996 | Hong | 437/43 |
| 5,567,635 | 10/1996 | Acovic et al. | |
| 5,583,066 | 12/1996 | Jung | 438/259 |
| 5,614,430 | 3/1997 | Liang et al. | |
| 5,670,401 | 9/1997 | Tseng. | |
| 5,707,897 | 1/1998 | Lee et al. | 438/257 |

FOREIGN PATENT DOCUMENTS 63-168053   7/1988   Japan .............................. 438/FOR 203

*Primary Examiner*—Richard A Booth
*Attorney, Agent, or Firm*—George O. Saile; Stephen B. Ackerman; Graham S. Jones, II

[57] ABSTRACT

A dielectric layer over a substrate is covered with a gate conductor mask and an organic polymer lining layer formed on the device narrows the mask opening to create a gate conductor molding trench by MERIE etching through the opening and dielectric down to the substrate. Then a gate oxide layer is formed. A conformal floating gate conductor is deposited over the device and down into the trench, narrowing the trench. A thin interelectrode dielectric layer covers the floating gate and further narrows the trench. A control gate layer covers the device and fills the trench. The floating gate, the interelectrode dielectric, and the control gate conductor are planarized down to the dielectric, which is stripped away. Then self-aligned source/drain regions are formed in the substrate. Semiconductor memory gate conductor stacks have increased surface area for improving the coupling ratio.

16 Claims, 5 Drawing Sheets

NON-VOLATILE MEMORY DEVICE WITH HIGH GATE COUPLING RATIO AND MANUFACTURING PROCESS THEREFOR

BACKGROUND OF THE INVENTION

1. Field of the Invention

This invention relates to MOSFET memory devices and more particularly to floating gate FET memory devices and manufacturing processes therefor.

2. Description of Related Art

U.S. Pat. No. 5,556,799 of Hong for a "Process for Fabricating A Flash EEPROM" shows a method for fabricating a flash EEPROM having a plurality of "U" shaped floating gates over which a control gate/word line structure spans a number of floating gates. Hong teaches that as flash EEPROM devices are made with finer resolutions, floating gate surface areas shrink. This decreases the capacitance of the effective capacitor between the floating gate layer and the control gate layer. The unwanted decrease in effective capacitance results in a reduction in the coupling ratio, which is a parameter that describes the coupling to the floating gate of the voltage present at the control gate of the device. The poor coupling of voltage to a floating gate limits the programming and accessing speed of the flash EEPROM device. Bit lines and drain regions are formed before the gate conductors are formed and so the devices provided do not have source/drain regions self-aligned with the gate conductors.

U.S. Pat. No. 5,496,753 of Sakurai et al. for "Method of Fabricating a Semiconductor Nonvolatile Storage Device" shows a method of forming an EEPROM memory device having a MONOS memory structure in which the gate is formed before the source/drain implants.

U.S. Pat. No. 5,459,091 of Hwang for "Method for Fabricating a Non-Volatile Memory Device" shows a method of forming an EEPROM memory device that has an "L" shape in which an "L" shaped gate conductor stack comprising a control gate and a floating gate is formed by etching away a vertical sidewall formed on the edge of a sacrificial CVD oxide film.

SUMMARY OF THE INVENTION $$\text{Coupling Ratio } CR = \frac{SA_{FG}}{SA_{TO}}$$

$SA_{FG}$=Surface Area of Floating Gate
$SA_{TO}$=Surface Area of Tunnel Oxide

An object of this invention is to provide a method of forming micrometer and/or deep-submicron memory devices with a minimum tendency for low gate coupling ratios and the structures resulting therefrom.

Another object of this invention is a method forming a non-volatile high gate coupling ratio memory structure.

A further object of this invention is a micrometer and/or deep-submicron memory device with a minimum tendency for low gate coupling ratios.

Still another object of this invention is a non-volatile memory structure with a high gate coupling ratio.

A method of forming a semiconductor memory devices includes these steps. Provide a doped silicon semiconductor substrate coated with a first dielectric layer. Form a mask with an opening through the mask and a conformal deposit of a lining material layer upon the device and upon the walls of the opening through the mask to narrow the opening. Etch through the opening to form a gate conductor molding trench through the conformal dielectric layer and through the first dielectric layer down to the substrate. Form a silicon oxide layer at the base of the trench. Deposit a conformal floating gate conductor layer over the device and on the exposed surfaces in the trench including the silicon oxide layer, leaving a narrowed trench in the floating gate conductor layer in the pattern of the gate conductor molding trench. Form a thin interelectrode dielectric layer upon the floating gate conductor layer leaving a further narrowed trench in the interelectrode dielectric layer in the pattern of the gate conductor molding trench. Deposit a control gate conductor layer over the device filling the further narrowed trench in the interelectrode dielectric layer and covering the device. Planarize the conformal floating gate conductor layer, the floating gate conductor layer, the thin interelectrode dielectric layer, and the control gate conductor layer down to the dielectric layer, stripping away the dielectric layer. Form self-aligned source/drain regions in the substrate.

Preferably, the conformal dielectric layer comprises an organic polymer material; the etching of the gate conductor trench is performed by MERIE etching through the conformal dielectric layer and the dielectric layer; the floating gate conductor layer and the control gate conductor layer are composed of doped polysilicon; the interelectrode dielectric layer is composed of ONO material; and the planarizing is performed by a CMP process.

BRIEF DESCRIPTION OF THE DRAWINGS

The foregoing and other aspects and advantages of this invention are explained and described below with reference to the accompanying drawings, in which:

FIG. 12 also shows a MOSFET memory device in accordance with this invention.

DESCRIPTION OF THE PREFERRED EMBODIMENT

FIGS. 1A, 1B and 2–12 show a process of manufacture of a MOSFET memory device 90 in accordance with this invention.

Figure 1A:
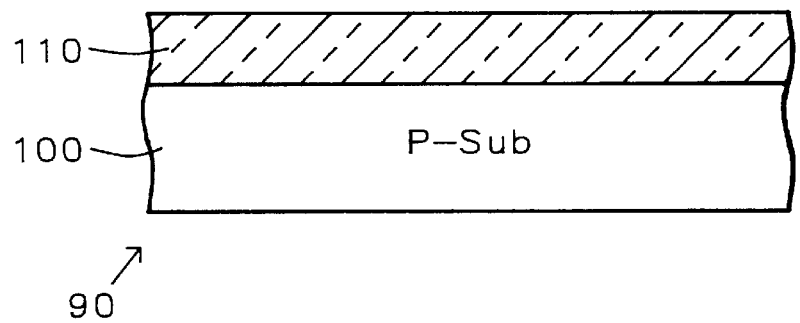
FIGS. 1A, 1B and 2–12 show a process of manufacture of a MOSFET memory device in accordance with this invention.

FIG. 1A shows the device 90 in accordance with this invention in an early stage of manufacture. A P– doped silicon semiconductor substrate 100 is coated with a conventional dielectric layer 110. Alternatively, the substrate 100 can be N– doped or an N– well depending upon product design choices and the doped regions in FIG. 12 will be modified accordingly, as is well known in the art.

Figure 1B:
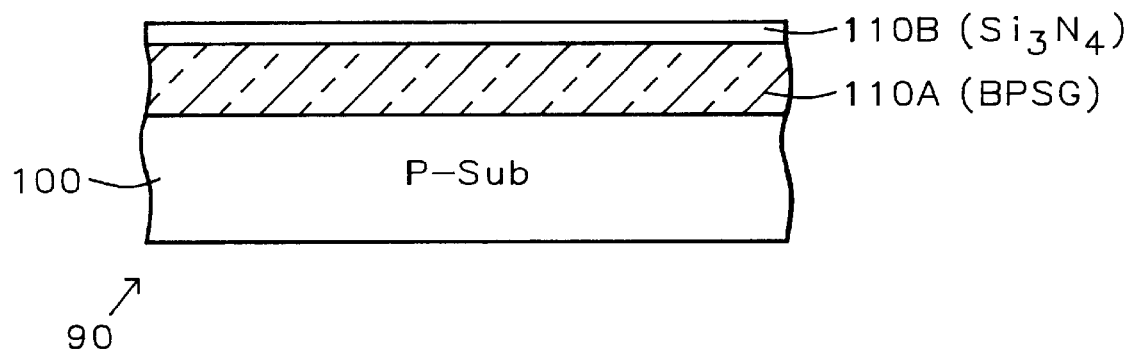

Referring to FIG. 1B, the dielectric layer can comprise a BPSG(BoroPhosphoSilicate Glass)/silicon nitride ($Si_3N_4$) stack 110A/110B. The BPSG layer 110A, which is from about 2,000 Å to about 4,000 Å thick, is covered with silicon nitride layer 110B from about 100 Å to about 500 Å thick. Silicon nitride layer 110B serves as a stopping layer for Chemical Mechanical Polishing (CMP) which is used in the process as described below with reference to FIG. 10.

Figure 2:
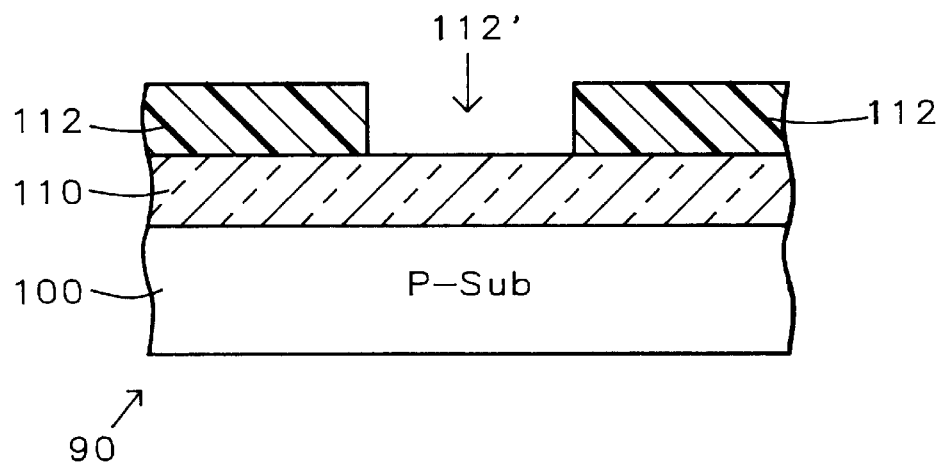

FIG. 2 shows the device 90 of FIG. 1 after a photoresist layer 112 (with a thickness from about 10,000 Å to about 14,000 Å) was formed on dielectric layer 110. The photoresist layer 112 is patterned with a first trench 112' extending therethrough (from top to bottom) which is formed with the minimum possible dimension, exposing a portion of the surface of dielectric layer 110.

Figure 3:
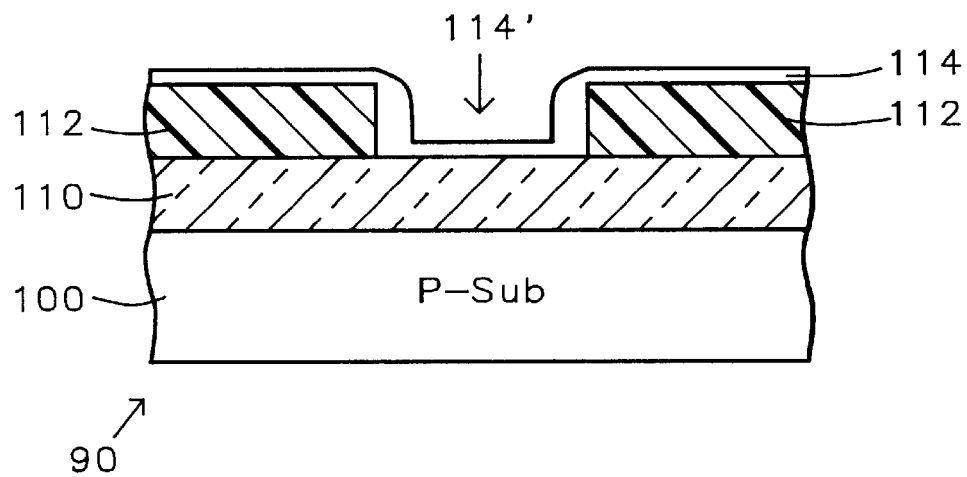

FIG. 3 shows the device 90 of FIG. 2 after a conformal non-volatile organic polymer liner 114 has been formed on the sidewalls of the first trench to narrow the first trench 112' with liner 114 to form a narrower trench 114'.

The appropriate organic polymers 114 and the thickness and method of application are polymer formation involving the reaction of photoresist and an etching gas such as $CF_4$, $CHF_3$, etc.

Figure 4:
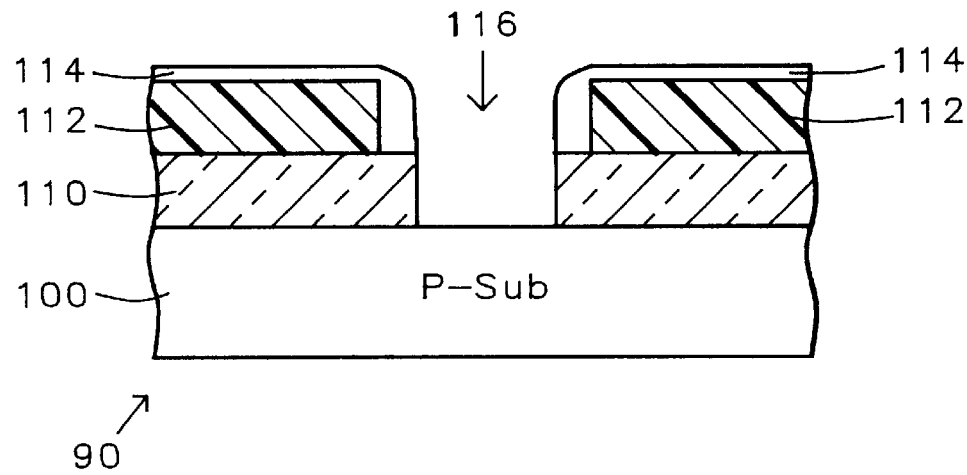

FIG. 4 shows the device 90 of FIG. 3 after a second trench 116 has been formed through the dielectric layer 110 down to the substrate 100 by an etching process for a making a second, deeper trench 116 through dielectric layer 110 preferably by employing the focussed drilling process of MERIE (Magnetically Enhanced, Reactive Ion Etching) to expose the top surface of silicon substrate 100. The second trench 116 is smaller in width than the minimum dimension.

A discussion of the MERIE etching process is found in Wolf "Silicon Processing for the VLSI Era—Vol. III—The Submicron VLSI MOSFET pages 506–507 (1995), as follows:

"The non-uniformities in a plasma which can give rise to local imbalances in collected charge can result from a variety of factors, including the following: (1) poor electrode design; . . . (2) non-uniform and/or time-varying magnetic fields; . . . (3) gas composition; e.g., use of highly electronegative gases (such as SF6); . . . and (4) gas flow conditions inside the plasma-reactor that cause unstable plasmas. Besides plasma nonuniformity there is concern that the drive toward higher plasma densities will increase charge damage since the charged particle currents are higher."

"An example of how a nonuniform magnetic field causes plasma non-uniformities is . . . magnetic field in a MERIE (magnetically enhanced, RIE reactor with a static magnetic field . . . . The effect of this magnetic field non-uniformity is to cause the electron flux to be larger than the ion flux near the wafer periphery, and the (positively charged) ion flux to be greater near the wafer center. Such magnetic field non-uniformities can also arise in ECR as well as MERIE plasma etchers."

Figure 5:
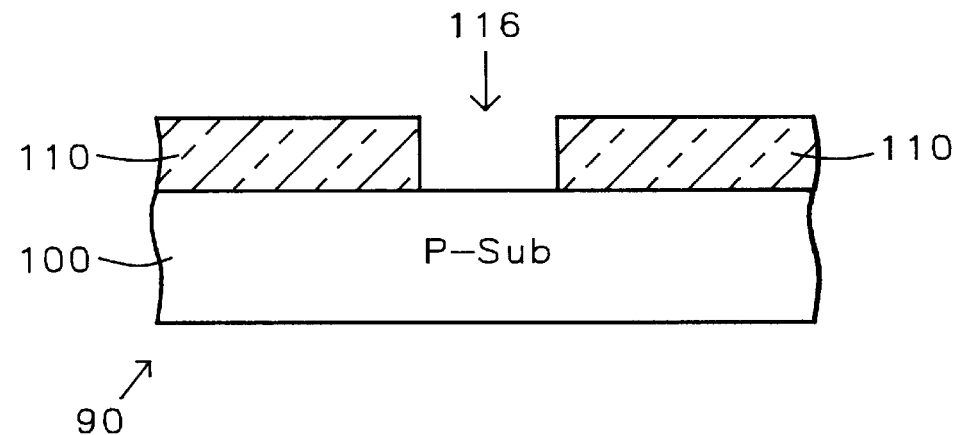

FIG. 5 shows the device 90 of FIG. 4 after stripping the photoresist layer 112 in a dry etching process using an oxygen ($O_2$) plasma in a plasma chamber. Next, the non-volatile polymer layer 114 is stripped in a wet sulfuric acid ($H_2SO_4$) bath comprising an aqueous solution leaving the remainder of the second trench 116 extending through the dielectric layer 110, followed by rinsing.

Figure 6:
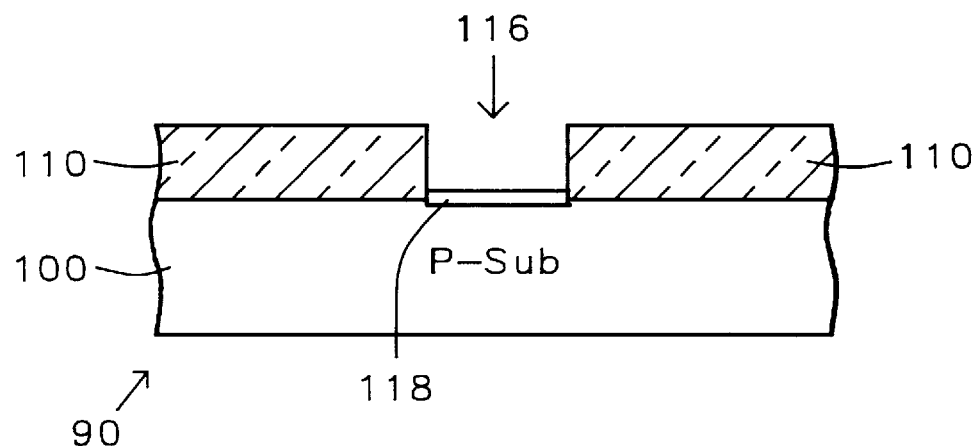

FIG. 6 shows the device 90 of FIG. 5 after tunnel oxide layer 118 was formed on the surface of the substrate at the bottom of the second trench 116 in dielectric layer 110. The tunnel oxide layer 118, with a thickness from about 50 Å to about 200 Å, is formed by a thermal oxidation process.

Figure 7:
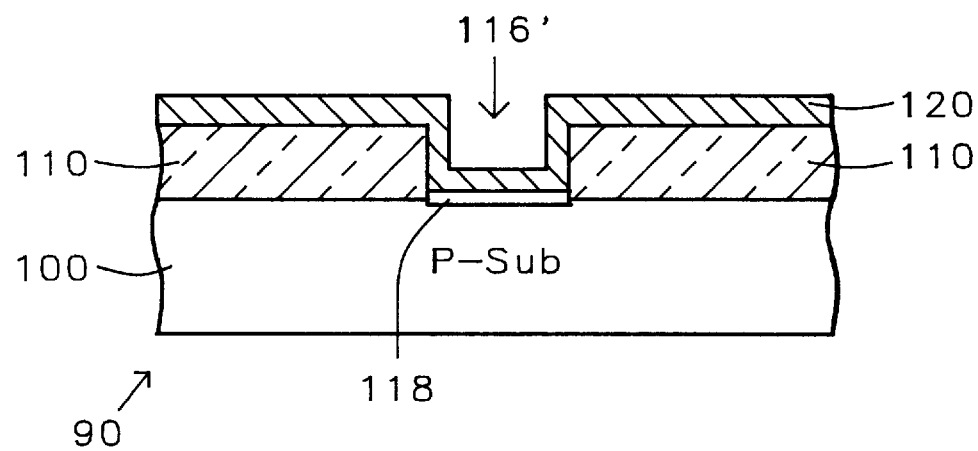

FIG. 7 shows the device 90 of FIG. 6 after formation of a conformal, blanket layer of a first polysilicon conductor layer 120 (the floating gate layer) over dielectric layer 110 and extending down into trench 116 along the sidewalls of trench 111 to the surface of tunnel oxide layer 118. First polysilicon conductor layer 120, which does not fill the second trench 116, has a thickness from about 1,000 Å to about 2,000 Å and layer 120 leaves a narrower trench 116' in trench 116. The doped polysilicon layer 120 is formed by a CVD (Chemical Vapor Deposition) process of deposition from silane ($SiH_4$) gas, nitrogen ($N_2$) gas in situ using phosphine ($PH_3$) gas for doping.

Figure 8:
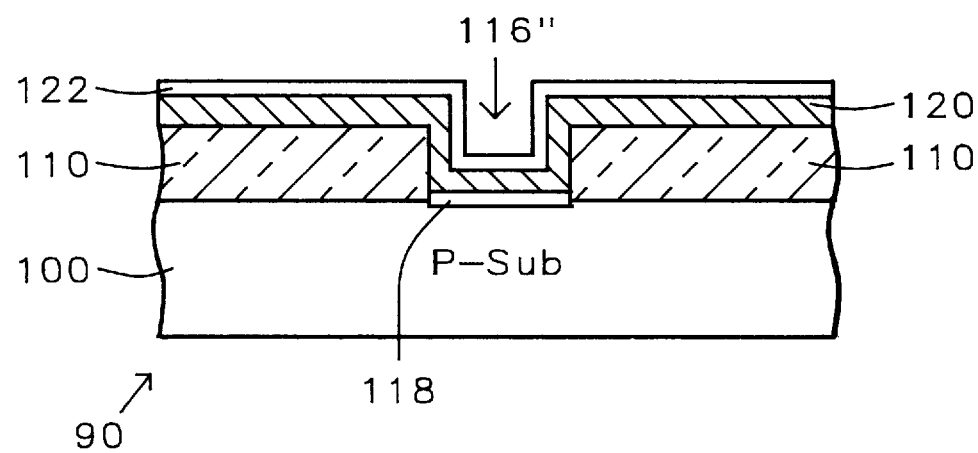

FIG. 8 shows the device 90 of FIG. 7 after formation of a thin inter-polysilicon, ONO, dielectric layer 122 having a thickness from about 10 Å to about 150 Å and leaving a still narrower trench 116" in trench 116'. A conventional ONO interconductor comprises successive layers of silicon Oxide ($SiO_x$), silicon nitride ($Si_3N_4$), silicon Oxide ($SiO_x$).

Figure 9:
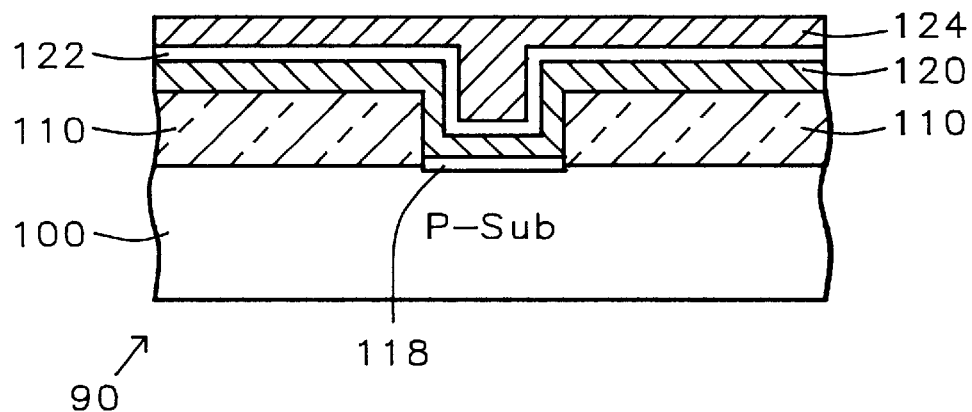

FIG. 9 shows the device 90 of FIG. 8 after formation of a blanket layer of a second polysilicon conductor layer 124 over interconductor (inter-polysilicon) dielectric layer 122 filling the hole 116". Second polysilicon conductor layer 124 has a thickness from about 1,000 Å to about 3,000 Å. The second polysilicon conductor layer 124 is preferably formed by a CVD (Chemical Vapor Deposition) process of deposition of silane ($SiH_4$) gas, nitrogen ($N_2$) gas, with in situ doping with phosphine ($PH_3$) gas.

Figure 10:
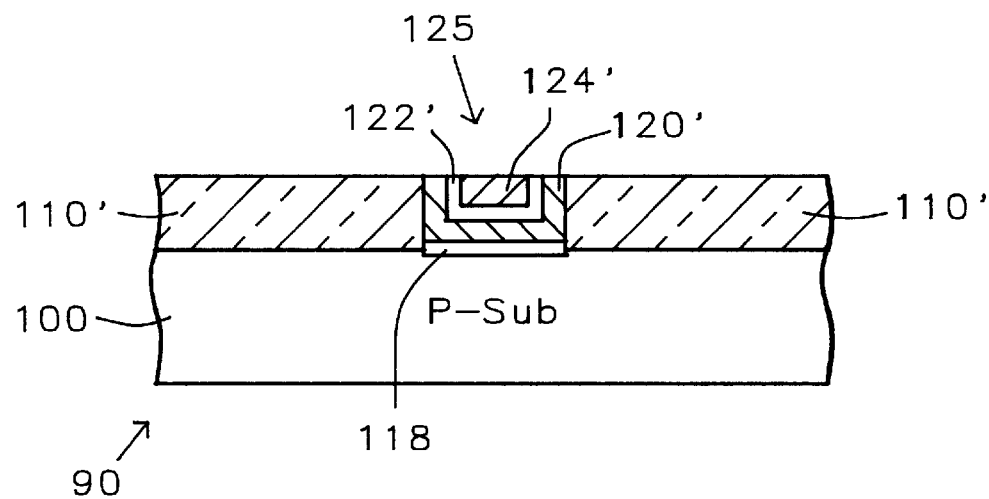

FIG. 10 shows the device 90 of FIG. 9 after Chemical Mechanical Polishing (CMP) removed the portion of the second polysilicon conductor layer 124, inter-polysilicon dielectric layer 122 and first polysilicon conductor layer 120 as well as a small portion of dielectric layer 110 leaving a thinner dielectric layer 110'. This produces a new gate conductor stack 125 comprising floating gate electrode 120', interpolysilicon layer 122' and control gate electrode 124' which were etched from the first polysilicon conductor layer 120, inter-polysilicon dielectric layer 122 and second polysilicon conductor layer 124 respectively. The layer 110' preferably includes silicon nitride layer 110A of FIG. 1B which serves as a conventional etch stop layer.

Figure 11:
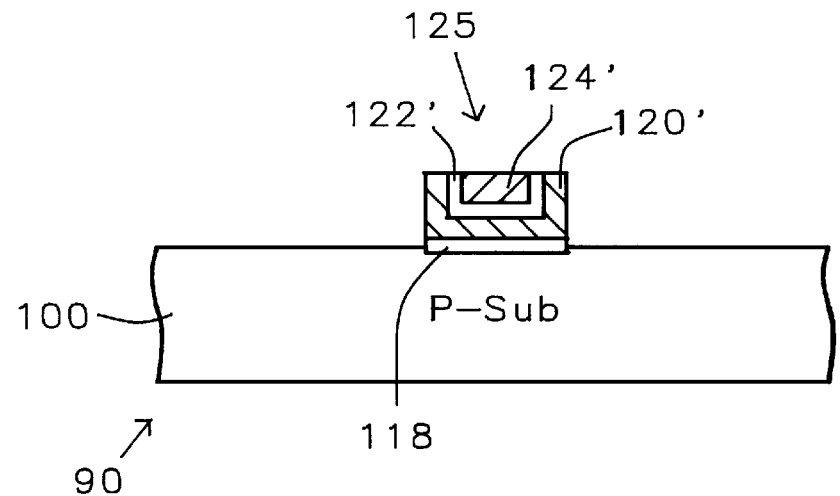

FIG. 11 shows the device 90 of FIG. 10 after the dielectric layer 110A has been removed to form non-volatile memory cell with high gate coupling ratio by a process of wet chemical etching with a dilute solution of hydrogen fluoride (HF) which results in exposure of the sidewalls of gate conductor stack 125 comprising floating gate electrode 120', interpolysilicon layer 122' and control gate electrode 124'.

Figure 12:
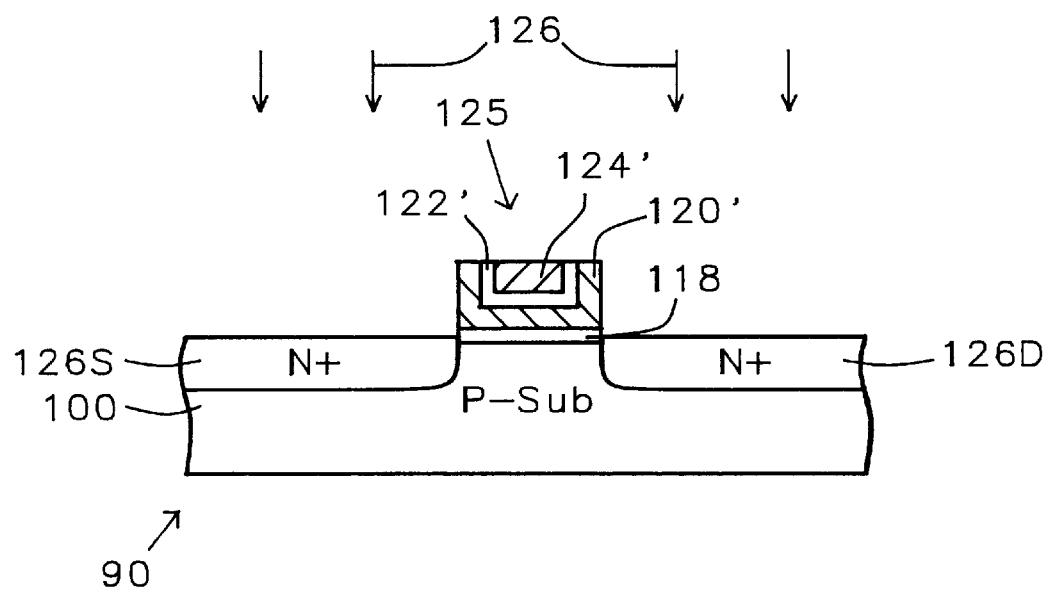

FIG. 12 shows the device 90 of FIG. 11 after the formation of source region 126S and drain region 126D by doping N type dopant ions 126 into substrate 100 aside from the gate conductor stack 125 in a self-aligned ion implantation process. The dopant is implanted preferably with a dose of N type ions of Arsenic (As) from about 1E15 ions/cm$^2$ to about 5E16 ions/cm$^2$ at an energy of from about 30 keV to about 100 keV. After annealing the dopant concentration in the source region 126S and drain region 126D is preferably from about 1E20 atoms/cm$^3$ to about 1E21 atoms/cm$^3$.

Non-volatile Memory with High Gate Coupling Ratio

Referring to FIG. 12, the semiconductor memory device 90 in accordance with this invention includes a doped silicon semiconductor substrate 100, a tunnel oxide layer 118 formed on the substrate 100, and a gate conductor stack 125 formed upon the silicon oxide layer 118.

The gate conductor stack 125 includes the floating gate conductor 120' with a U-shaped cross section, the thin interelectrode ONO dielectric layer 122' with a U-shaped cross section, and a control gate conductor 124'.

The floating gate conductor 120' is formed over the top surface of the tunnel oxide layer 118 with a deep trench in the top surface of the floating gate conductor layer 120' in which the thin interelectrode dielectric layer 122' is formed upon the inner surfaces of the trench in the floating gate conductor 120' leaving a further narrowed trench in the interelectrode dielectric layer 122'. The control gate conductor layer 124' fills the further narrowed trench in the interelectrode dielectric layer 122'.

The source/drain regions 126S/126D are formed in the substrate self-aligned with the gate conductor stack 125.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a semiconductor memory device including the steps as follows:

providing a doped silicon semiconductor substrate coated with a glass, lower, dielectric layer covered in turn with an upper dielectric layer of silicon nitride, then forming over said upper dielectric layer a mask with an initial opening down through said mask to expose a future trench location on said upper dielectric layer, said opening having sidewalls, forming a blanket conformal deposit of a lining material layer covering said future trench location as well as covering said mask and said sidewalls of said opening through said mask to form a narrowed opening in said initial opening, etching through said narrowed opening to form a gate conductor molding trench down through said upper, silicon nitride dielectric layer and down through said lower, glass dielectric layer down to said substrate, stripping away said mask and said lining material, forming a silicon oxide layer at the base of said gate conductor molding trench, depositing a conformal floating gate conductor layer in a CVD process yielding polysilicon formed in silane and nitrogen gases, on the exposed surfaces in said gate conductor molding trench including said silicon oxide layer, leaving a narrowed trench in said floating gate conductor layer in the pattern of said gate conductor molding trench, forming a thin interelectrode ONO dielectric layer upon said floating gate conductor layer leaving a further narrowed trench in said interelectrode dielectric layer in the pattern of said gate conductor molding trench, depositing a polysilicon control gate conductor layer in a CVD process with silane and nitrogen gases, filling said further narrowed trench in said interelectrode dielectric layer and covering said ONO dielectric layer planarizing said conformal floating gate conductor layer, said floating gate conductor layer, said thin interelectrode dielectric layer, and said control gate conductor layer down to said dielectric layer by CMP, stripping away said dielectric layer, and forming self-aligned source/drain regions in said substrate.

2. The method in accordance with claim 1 wherein said etching of said gate conductor trench is performed by MERIE etching through said dielectric layer.

3. The method in accordance with claim 1 wherein:

said floating gate conductor layer and said control gate conductor layer are composed of polysilicon doped in situ with phosphine gas.

4. A method of forming a semiconductor memory device including the steps as follows:

providing a doped silicon semiconductor substrate coated with a glass, lower, dielectric layer covered in turn with an upper dielectric layer of silicon nitride, forming a mask with a surface and an opening through said mask, forming a blanket conformal deposit of a lining material layer upon covering said mask and the walls of said opening through said mask to narrow said opening, etching through said opening to form a gate conductor molding trench through said upper and lower dielectric layers down to said substrate, forming a silicon oxide layer at the base of said trench, depositing a conformal floating gate conductor layer on the exposed surfaces in said trench including said silicon oxide layer, leaving a narrowed trench in said floating gate conductor layer in the pattern of said gate conductor molding trench, forming a thin interelectrode dielectric layer upon said floating gate conductor layer leaving a further narrowed trench in said interelectrode dielectric layer in the pattern of said gate conductor molding trench, depositing a control gate conductor layer filling said further narrowed trench in said interelectrode dielectric layer and covering said interelectrode dielectric layer, planarizing said conformal floating gate conductor layer, said thin interelectrode dielectric layer, and said control gate conductor layer down to said silicon nitride dielectric layer, stripping away said lower and upper dielectric layers, and forming self-aligned source/drain regions in said substrate.

5. A method in accordance with claim 4 wherein said conformal dielectric layer comprises an organic polymer material.

6. A method in accordance with claim 4 wherein said etching of said gate conductor trench is performed by MERIE etching through said conformal dielectric layer and said dielectric layer.

7. The method in accordance with claim 4 wherein said floating gate conductor layer and said control gate conductor layer are composed of doped polysilicon.

8. The method in accordance with claim 4 wherein said interelectrode dielectric layer is composed of ONO material.

9. The method in accordance with claim 4 wherein said planarizing is performed by a CMP process.

10. A method in accordance with claim 5 wherein said etching of said gate conductor trench is performed by MERIE etching through said conformal dielectric layer and said dielectric layer.

11. The method in accordance with claim 10 wherein said floating gate conductor layer and said control gate conductor layer are composed of doped polysilicon.

12. The method in accordance with claim 11 wherein said interelectrode dielectric layer is composed of ONO material.

13. The method in accordance with claim 12 wherein said planarizing is performed by a CMP process.

14. A method of forming a semiconductor memory device including the steps as follows:

providing a doped silicon semiconductor substrate coated with a BPSG glass, lower, dielectric layer from about 2,000 Å thick to about 4,000 Å thick covered in turn with an upper dielectric layer of silicon nitride from about 100 Å thick to about 500 Å thick, then forming over said upper dielectric layer a mask with an opening through said mask down to expose a future trench location on said upper dielectric layer, said opening having sidewalls, then forming a blanket conformal deposit of a lining material layer covering said future trench location as well as covering said mask and said sidewalls of said opening through said mask to form a narrowed opening, etching through said narrowed opening to form a gate conductor molding trench through said lower, dielectric layer and said upper, dielectric layer down to said substrate, stripping away said mask and said lining material, forming a silicon oxide layer at the base of said gate conductor molding trench from about 50 Å thick to about 200 Å thick, depositing a conformal floating gate conductor layer in a CVD process yielding a thickness about 1,000 Å thick to about 2,000 Å thick of polysilicon formed in silane gas and nitrogen gas, on the exposed surfaces in said gate conductor molding trench including said silicon oxide layer, leaving a narrowed trench in said floating gate conductor layer in the pattern of said gate conductor molding trench, forming a thin interelectrode ONO dielectric layer upon said floating gate conductor layer leaving a further narrowed trench in said interelectrode dielectric layer in the pattern of said gate conductor molding trench, depositing a control gate conductor layer in a CVD process yielding a thickness about 1,000 Å thick to about 3,000 Å thick of polysilicon formed in silane and nitrogen gases filling said further narrowed trench in said interelectrode dielectric layer planarizing said conformal floating gate conductor layer, said thin interelectrode dielectric layer, and said control gate conductor layer down to said upper dielectric layer by CMP, stripping away said upper and lower dielectric layers, and forming self-aligned source/drain regions in said substrate.

15. The method in accordance with claim 14 wherein said etching of said gate conductor trench is performed by MERIE etching through said dielectric layer.

16. The method in accordance with claim 14 wherein said floating gate conductor layer and said control gate conductor layer are composed of polysilicon doped in situ with phosphine gas.

* * * * *